US005661663A

United States Patent [19]

Scepanovic et al.

[11] Patent Number: 5,661,663

[45] Date of Patent: Aug. 26, 1997

[54] PHYSICAL DESIGN AUTOMATION SYSTEM AND METHOD USING HIERARCHICAL CLUSTERIZATION AND PLACEMENT IMPROVEMENT BASED ON COMPLETE RE-PLACEMENT OF CELL CLUSTERS

[75] Inventors: Ranko Scepanovic; James S. Koford, both of San Jose, Calif.; Valeriy B. Kudryavtsev, Moscow, Russian Federation; Alexander E. Andreev, Moskovskaja Oblast, Russian Federation; Stanislav V. Aleshin; Alexander S. Podkolzin, both of Moscow, Russian Federation

[73] Assignee: LSI Logic Corporation, Milpitas, Calif.

[21] Appl. No.: 409,757

[22] Filed: Mar. 24, 1995

[51] Int. Cl.[6] .................................................. H01L 23/50
[52] U.S. Cl. ................................................................ 364/490
[58] Field of Search .............................. 364/488, 489, 364/490, 491, 419.14, 428.28; 395/500

[56] References Cited

U.S. PATENT DOCUMENTS

| | | | |
|---|---|---|---|
| 4,577,276 | 3/1986 | Dunlop et al. | 364/491 |
| 4,815,003 | 3/1989 | Putatunda et al. | 364/491 |
| 4,908,772 | 3/1990 | Chi | 364/491 |
| 4,918,614 | 4/1990 | Modarres et al. | 364/490 |
| 5,202,840 | 4/1993 | Wong | 364/490 |
| 5,239,465 | 8/1993 | Hattori et al. | 364/419.19 |
| 5,521,837 | 5/1996 | Frankle et al. | 364/491 |
| 5,557,533 | 9/1996 | Koford et al. | 364/491 |
| 5,568,636 | 10/1996 | Koford | 395/500 |

OTHER PUBLICATIONS

Wei–Ming Dai and Ernest S. Kuh; *Simultaneous Floor Planning and Global Routing for Hierarchical Building–Block Layout*; IEEE Transactions on Computer–Aided Design, vol. CAD–6, No. 5, Sep. 1987, pp. 828–837.

Wayne Wei–Ming Dai, Bernhard Eschermann, Ernest S. Kuh and Massoud Pedram; *Hierarchical Placement and Floorplanning in BEAR*; IEEE Transactions on Computer–Aided Design, vol. 8, No. 12, Dec. 1989, pp. 1335–1349.

M.Y. Yu, X.L. Hong, Y.E. Lien, Z.Z. Ma, J.G. Bo and W.J. Zhuang; *A New Clustering Approach and Its Application to BBL Placement*; IEEE, 1990; pp. 665–669.

Carl Sechen and Kai–Win Lee; *An Improved Simulated Annealing Algorithm for Row–Based Placement*; IEEE, 1987, pp. 478–481.

James P. Cohoon and William D. Paris; *Genetic Placement*; IEEE, 1986, pp. 422–425.

CHAMP: Chip Floor Plan for Hierarchical VLSI Layout Design.

*Primary Examiner*—Kevin J. Teska
*Assistant Examiner*—Dan Fiul
*Attorney, Agent, or Firm*—Oppenheimer Poms Smith

[57] ABSTRACT

A method of producing a placement of cells for a microelectronic integrated circuit in accordance with specified cell interconnects includes constructing a hierarchial cluster tree based on the interconnects in which a lowest level of the tree includes clusters of interconnected cells, and each successively higher level includes clusters of interconnected clusters from a successively lower level. Clusters in each level are merged by a min-cut operation. Clusters of each successively lower level are then placed within clusters of each successively higher level in progressively decreasing order of levels. Clusters are placed in each level by computing a current gravity point for each cluster in accordance with the cells therein, computing a new gravity point for each cluster in accordance with the current gravity points and the interconnects, and moving each cluster from the current gravity point to the new gravity point. Cells within clusters of the lowest level are then placed by calculating positions of the cells in a row direction, and placing the cells in columns in increasing order of the calculated positions in the row direction. The method is implemented by a parallel processing system including a plurality of parallel processors.

41 Claims, 11 Drawing Sheets

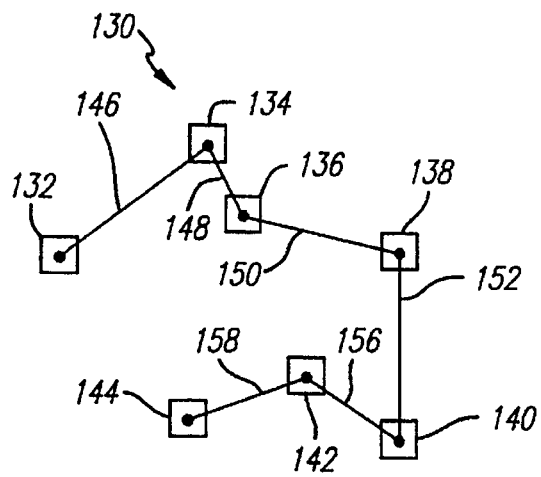
FIG. 5a
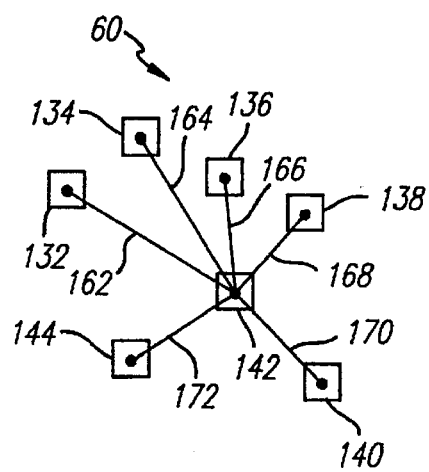
FIG. 5b
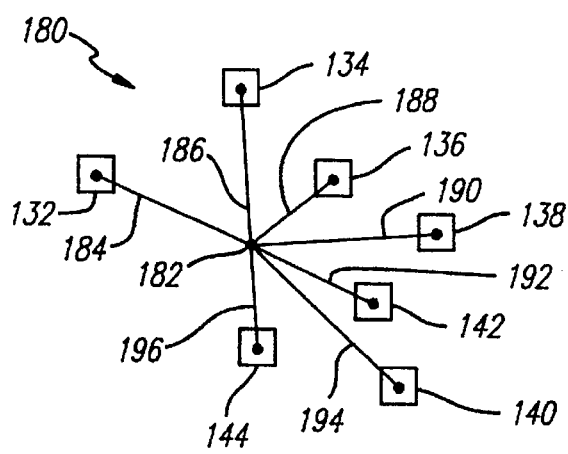
FIG. 5c
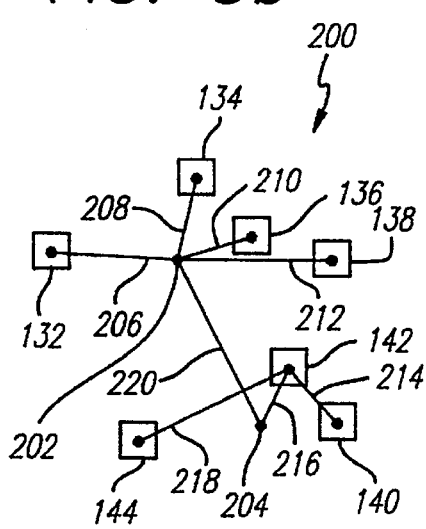
FIG. 5d
FIG. 5e

PHYSICAL DESIGN AUTOMATION SYSTEM AND METHOD USING HIERARCHICAL CLUSTERIZATION AND PLACEMENT IMPROVEMENT BASED ON COMPLETE RE-PLACEMENT OF CELL CLUSTERS

BACKGROUND OF THE INVENTION

1. Field of the Invention

The present invention generally relates to the art of microelectronic integrated circuits, and more specifically to a physical design automation system and method for producing a cell placement for an integrated circuit chip using hierarchical clusterization and placement improvement based on complete replacement of cell clusters.

2. Description of the Related Art

Microelectronic integrated circuits include large numbers of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight. tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Each microelectronic circuit cell includes a plurality of pins or terminals, each of which is connected to pins of other cells by a respective electrical interconnect wire network or net. A goal of the optimization process is to determine a cell placement and routing such that all of the required interconnects can be made, and the total wirelength and interconnect congestion are minimized.

Existing placement methods based on hierarchical clusterization perform an exhaustive search over all possible configurations. Examples of such method as described in the following articles:

"SIMULTANEOUS FLOOR PLANNING AND GLOBAL ROUTING FOR HIERARCHICAL BUILDING-BLOCK LAYOUT", by W. Dai et al, IEEE Transactions on Computer-Aided Design, Vol. 6, No. 5, 1987, pp. 828–837.

"HIERARCHICAL PLACEMENT AND FLOORPLANNING IN BEAR", by W. Dai et al, IEEE Transactions on Computer-Aided Design, Vol. 8, No. 12, 1989, pp. 1335–1349.

"A NEW CLUSTERING APPROACH AND ITS APPLICATION TO BBL PLACEMENT", by M. Yu et al, IEEE Transactions on Computer-Aided Design, Vol. 9, No. 12, 1990, pp. 665–669.

As a result of the exhaustive search and exponential growth of possible configurations, the number of subclusters in each cluster is very limited (not greater than 4–5). At the same time, this real bound on the number of clusters in each hierarchical level ends up with a reduction of the placement quality.

Investigations in the above referenced article to Yu points out the necessity of using the largest possible groups of clusters and a smaller number of hierarchical levels.

The other disadvantage of known placement algorithms which are based on iterative improvement of an initial placement is the time consuming process of overcoming of the effect of local extrema. Examples of this kind of algorithm are simulated annealing and genetic algorithms which use stochastic principles to overcome the local extrema effect as described in the following articles:

"AN IMPROVED SIMULATED ANNEALING ALGORITHM FOR ROW-BASED PLACEMENT", by C. Sechen et al, IEEE Conference on Computer-Aided Design, 1987, pp. 478–481.

"GENETIC PLACEMENT", by J. Cohoon et al, IEEE International Conference on Computer-Aided Design, 1986, pp. 422–425.

In view of the above, there exists a need in the art for a physical design automation system which is able to generate large clusters without performing an exhaustive search of all possible combinations, while simultaneously overcoming of the effects of local extrema.

SUMMARY OF THE INVENTION

An important object of the present invention is the achievement of placement optimization based on clusterization in order to overcome the effect of local extrema.

A method of producing a placement of cells for a microelectronic integrated circuit in accordance with specified cell interconnects includes constructing a hierarchial cluster tree based on the interconnects in which a lowest level of the tree includes clusters of interconnected cells, and each successively higher level includes clusters of interconnected clusters from a successively lower level. Clusters in each level are merged by a min-cut operation.

Clusters of each successively lower level are then placed within clusters of each successively higher level in progressively decreasing order of levels. Clusters are placed in each level by computing a current gravity point for each cluster in accordance with the cells therein, computing a new gravity point for each cluster in accordance with the current gravity points and the interconnects, and moving each cluster from the current gravity point to the new gravity point.

Cells within clusters of the lowest level are then placed by calculating positions of the cells in a row direction, and placing the cells in columns in increasing order of the calculated positions in the row direction.

The method is implemented by a parallel processing system including a plurality of parallel processors, and is able to generate large clusters without performing an exhaustive search of all possible combinations, while simultaneously overcoming of the effects of local extrema.

These and other features and advantages of the present invention will be apparent to those skilled in the art from the following detailed description, taken together with the accompanying drawings, in which like reference numerals refer to like parts.

DESCRIPTION OF THE DRAWINGS

FIGS. 5a to 5e are diagrams illustrating alternative methods of converting a hypergraph into a graph;

DETAILED DESCRIPTION OF THE INVENTION

Figure 1:
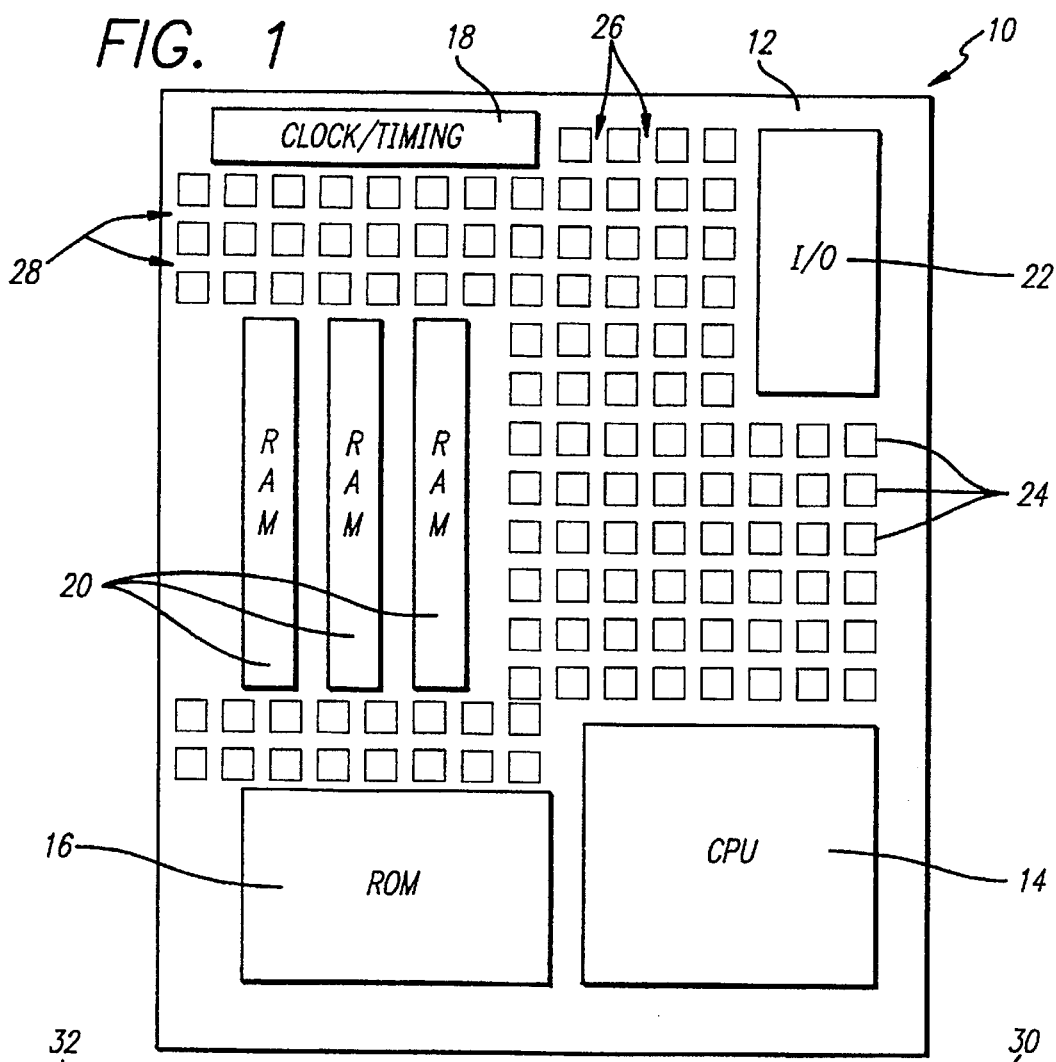
FIG. 1 is a simplified diagram illustrating a conventional rectilinear integrated circuit interconnect routing arrangement.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
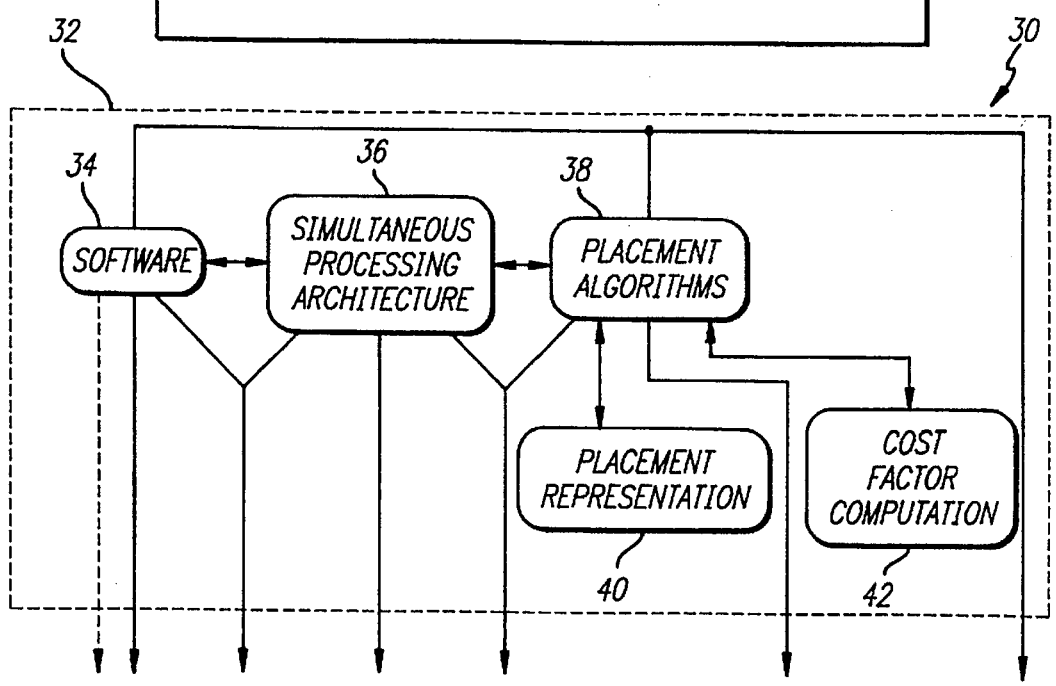
FIG. 2 is a block diagram illustrating a physical design automation system embodying the present invention.

FIG. 2 illustrates an integrated circuit physical design automation system 30 for producing an optimized placement of the cells 24 such as illustrated in FIG. 1 in accordance with a method of the present invention.

The system 30 receives inputs for a user specified integrated circuit design including a netlist, a library of standardized microelectronic elements or cells and functional units including combinations of cells, and a set of rules that define the objectives of the design.

The system 30 decomposes these inputs into a plurality of parallel processes or tasks that are executed simultaneously using individual processing units. In general, one or more processors coordinate the operation of other processors, which are optimized, evaluated and recombined to produce an optimal cell placement and routing that satisfy a predetermined performance objective.

The optimal cell placement and routing produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or algorithms 38 for placement, routing and measuring the relative fitnesses of cell placements and optimizing the fitnesses. Implementation of the algorithms 38 is facilitated by a cell placement representation 40 and cost function or quality factor computation 42. The architecture 36 can be of any type, such as Distributed Shared Memory (DSM), that enables parallel processing in accordance with the method of the invention.

The architecture 36 collectively implements the functions of a tree construction means, cluster placement means, cell placement means, control means and other functional means by assigning different parallel processors to perform these functions and combining the results thereof as will become evident from the following description.

Figure 3:
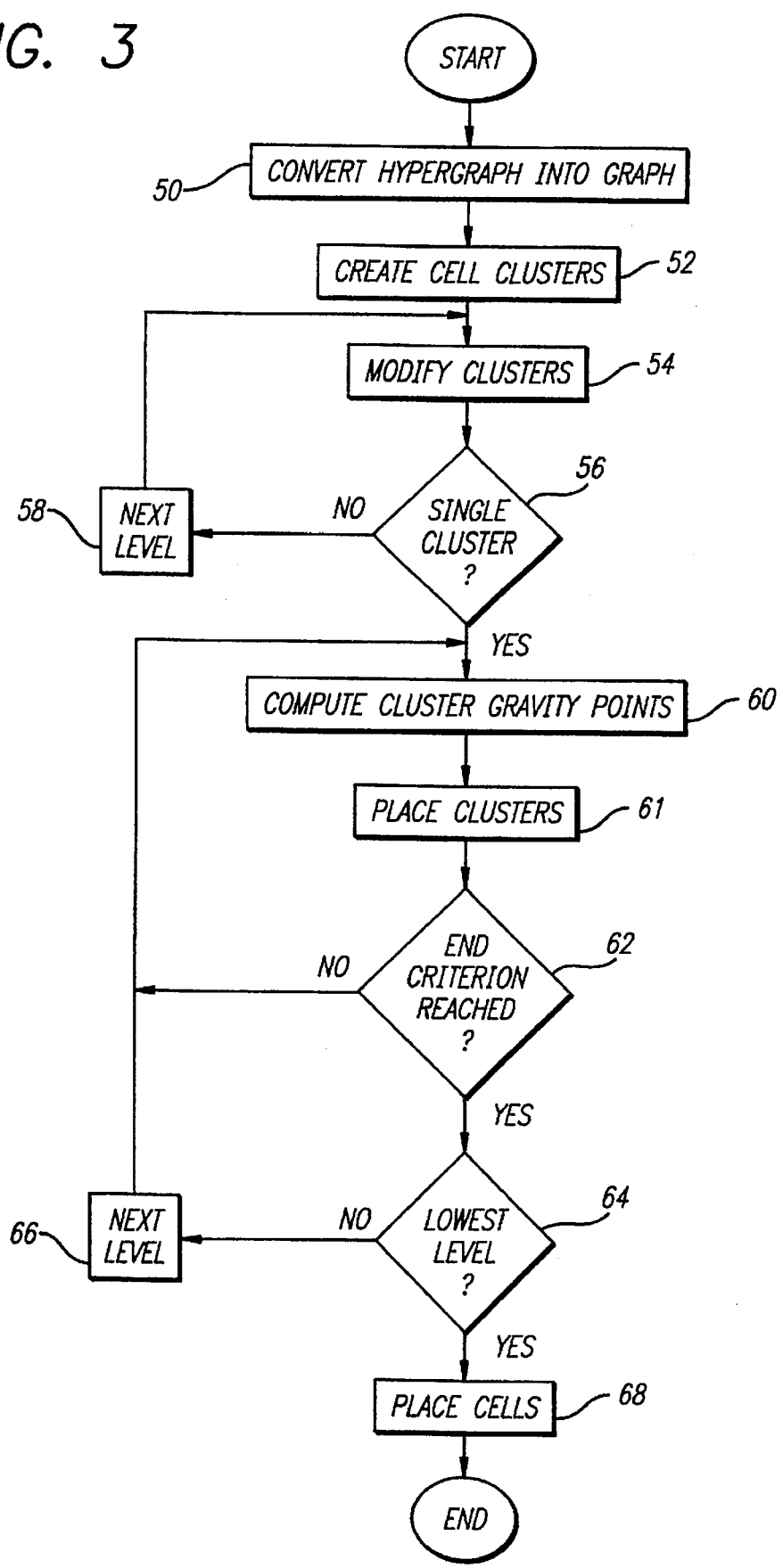
FIG. 3 is a flowchart illustrating a method of producing a placement of cells for a microelectronic integrated circuit using the physical design automation system of FIG. 2.

The general outline of the present method is illustrated in flowchart form in FIG. 3. The method will be described first concisely using mathematical set theory notation, and then in a narrative manner with reference to the figures of drawing.

The placement problem is specified as a set of functional microelectronic device cells, and a netlist including nets of interconnect wires that interconnect the cells to produce the required logical functionality. The cells can be of the same size, as in a gate array, or of various different sizes. The cells can have the same width and different heights, the same height and different widths, and/or different widths and heights.

The set of cells and netlist are represented as a hypergraph H, in which the cells constitute vertices and the interconnect wires of the nets constitute edges. The hypergraph does not have any specific spatial form, as the cells can be located anywhere and the interconnects can take a number of forms. The latter is because an interconnect net specifies cells that are to be electrically interconnected, but does not specify any particular configuration of wires to perform the interconnection.

As indicated as a step 50 in FIG. 3, the hypergraph H is converted into a graph G which includes the vertices of the hypergraph H. However, the nets of the hypergraph are replaced by discrete edges that are defined in a predetermined manner. Although the graph G still does not provide any particular geometric configuration, it specifies specific edges (wires) for interconnecting cells (vertices) which are lacking in the hypergraph H.

The graph G is constructed by substituting each hyperedge in the hypergraph H with an edge or edges of a cluster tree T. This tree can be a linear randomly chosen chain of edges. If simple nets (2–3 pins) predominate 85% in a netlist, the manner of transformation of H into G does not affect clusterization. In cases where the optimization goals are explicitly formulated, procedures of transformation of H into G can be applied that are based on these goals.

The vertices of the graph G are leaves of the tree T which are designated as the 0-th level of the tree T. All other vertices of the tree T are clusters such that a cluster of the i-th level is formed by all of its connections (edges of T) with elements from (i-1)-th level.

i=1, 2, . . . , p, where p is the index of the root of the tree T. If the (i-1)-th level of the tree has been already constructed, the construction of the i-th level consists of two steps: preclusterization as indicated as a step 52, and modification as indicated as a step 54.

For i=0, the pre-clusterization step 52, disjoint spheres are created with radius equal to 1 of vertices of G (i.e., all vertices adjacent to a given vertex) as preclusters of the 0-th level. When i≧1, clusters are taken from the previous level as clusters of the i-th level. After forming clusters, they are modified using a min-cut type algorithm such as described in an article entitled "A LINEAR-TIME HEURISTIC FOR IMPROVING NETWORK PARTITIONS", by C. Fiduccia and R. Mattheyses, Proceedings of the 19th Design Automation Conference, 1982, pp. 175–181. The steps 52 and 54 create the cluster tree T in which the clusters (preclusters) of the lowest level are formed of cells (vertices), and the highest level consists of a single cluster. Step 54 is repeated for each level until the highest level is reached as indicated by a loop including steps 56 and 58.

The clusterization steps 52 and 54 create clusters for re-placement in subsequent steps. The significance of this phase is in extracting from the graph G sufficiently "natural" compact groups of vertices with comparable weak upper bounds for their number of elements (e.g., not more than 50–100 elements).

After constructing the cluster tree, regions for placing clusters of p-th, (p-1)-th, . . . , 1-st level of the tree are determined in descending order of levels. If regions for placing clusters of the i-th level have been determined, a sequence of their complete re-placement is applied. Assuming that a rectangular region P has been determined for placing of the cluster K from the i-th level of the tree, following steps are iteratively repeated in order to improve the placement of subclusters of the cluster K within the region P.

Starting with an initial placement (which can be random), the next step 60 is to calculate the coordinates $(x_1, Y_1), \ldots, (x_n, Y_n)$ of the gravity points of first time random subclusters of P which are determined from the previous iterative step for placing subclusters $K_n, \ldots K_n$ of the cluster K.

The desired geometric configuration of the placement of subclusters is then determined in a step 61 by computing new respective gravity points $(x_1', y_1'), \ldots, (x_n', y_n')$ according to the following formulas:

$$x_j' = \frac{(x_j + m_1 x_{j_1} + \ldots + m_s x_{j_s})}{1 + m_1 + \ldots + m_s}, \quad = y_j' = \frac{(y_j + m_1 y_{j_1} + \ldots + m_s y_{j_s})}{1 + m_1 + \ldots + m_s},$$

where $m_1$ is the number of edges connecting a vertex of the subcluster $K_j$ with a vertex of the subcluster $K_{j1}$.

In other words, for the new gravity point of a subcluster, the gravity point of all edges connecting the subcluster with other subclusters is computed. The new gravity points constitute a plan of complete re-placement of the tree T of subclusters which characterize their relative positions in terms of relations "left-right" and "up-down".

According to the re-placement plan, subclusters of K in the region P are placed by halving the rectangle P such that the halves $P_1$ and $P_2$ are as close as possible to squares and corresponding partitions of K are as close as possible in terms of sums of areas (or only heights if widths of all cells are equal) of cells which belong to the partitions. The halving process is continued until single subclusters of K are reached.

This process is repeated in descending order of levels of the cluster tree T as indicated by a loop including steps 62, 64 and 66. When the lowest level is reached in which the clusters include cells, the cells are placed "column by column" as indicated in a step 68.

First, the group of new gravity points of the re-placement plan which are further left from others are extracted, which have the sum of the corresponding cell heights equal to the column height. These points are placed according to the y-coordinates of their plan points. The operation proceeds in the same manner to fill all columns form left to the right.

The present invention provides a constructive placement method which does not involve an exhaustive search of possible combinations, and is therefore not susceptible to the effects of local extrema. A more detailed description of the present invention will now be presented with reference to the additional figures of drawing.

Figure 4:
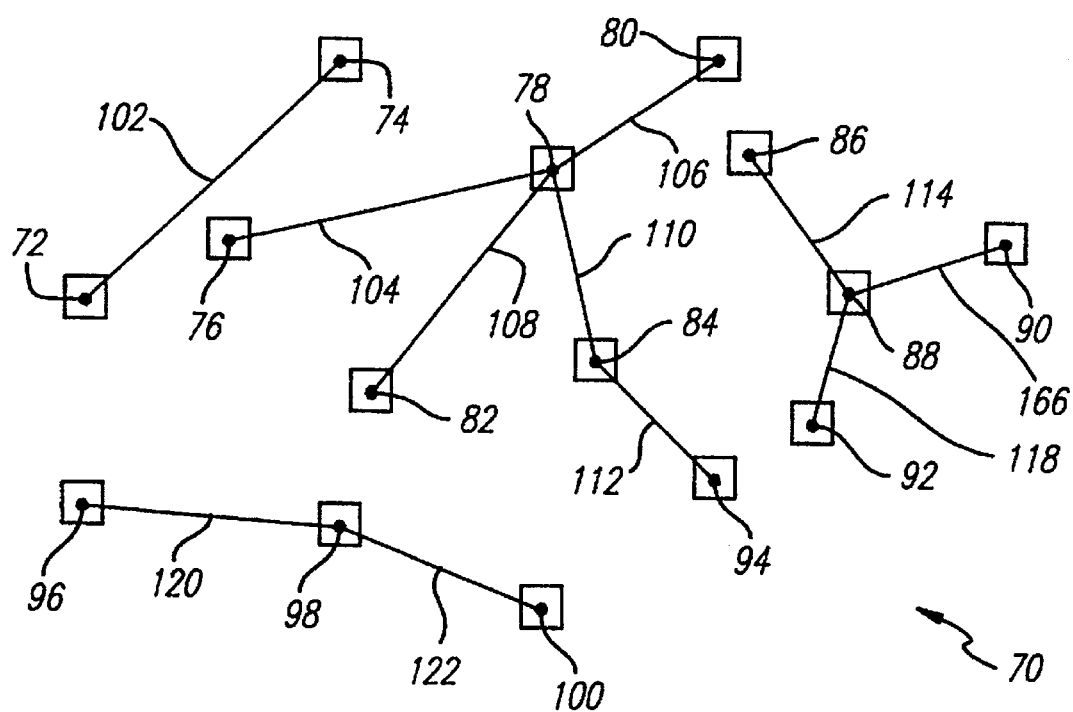
FIG. 4 is a diagram illustrating a hypergraph including a simplified set of cells and interconnect nets for placement using the present invention.

A graph 70 that was constructed from a specified set of cells and an interconnect netlist is illustrated in FIG. 4. The graph 70 includes cells (vertices) 72 to 100 that are interconnected by wires (edges) 102 to 122.

The cells 72 and 74 are interconnected a two-pin net that consists of the single wire 102. Thus, only one interconnection is possible. The other cells are interconnected by nets consisting of more than one wire, and can be interconnected in different ways as specified by the hypergraph (netlist). FIG. 4 illustrates only one possible graph 70 based on the hypergraph.

Step 50 of FIG. 3 comprises converting a hypergraph into a graph, in which the nets are replaced by discrete edges. The edges can be defined in any known manner in accordance with the invention. For example, FIG. 5a illustrates a grouping 130 of seven cells 132 to 144 that are specified as being interconnected by a single interconnect wire net in the netlist (hypergraph). The net of the hypergraph is converted into discrete form as a linear chain of edges 146 to 158 that lead from the cell 132 to the cell 144 as shown.

The order of chain connected edges can be selected at random, or using any other method. Rather than the illustrated arrangement, for example, in which the cells 138, 140, 142 and 144 are connected in order, these cells could be chain connected by edges in the order 138, 142, 140 and 144.

FIG. 5b illustrates a grouping 160 of the cells 132 to 144 in which the net is converted into a star configuration with the cell 142 at the center of the star. The other cells are connected to the cell 142 by edges 132 to 172 as shown.

FIG. 5c illustrates another grouping 180 in which the cells 132 to 144 are interconnected in a star configuration by edges 184 to 196 which join at a virtual point 182. A similar grouping 200 is illustrated in FIG. 5d as a star configuration including two virtual points 202 and 204 and edges 206 to 220.

The graph can also represent the nets in the form of trees as in a grouping 230 illustrated in FIG. 5e. The cell 132 is the root of the tree, with the cell 136 being connected thereto by an edge 232 which constitutes a branch. The cells 134 and 138 are branched from the cell 132 by edges 234 and 236, whereas the cell 142 is branched from the cell 138 by an edge 238. The cells 140 and 144 branch from the cell 142 via edges 240 and 242.

Various tree configurations can be constructed in accordance with the present invention, such as minimum Steiner trees. The particular method of converting a hypergraph into a graph is not the particular subject matter of the invention, and can be performed using any suitable algorithm or function. The purpose of the step 50 is to produce a discrete set of cell interconnections for operation thereon in subsequent steps.

Figure 6:
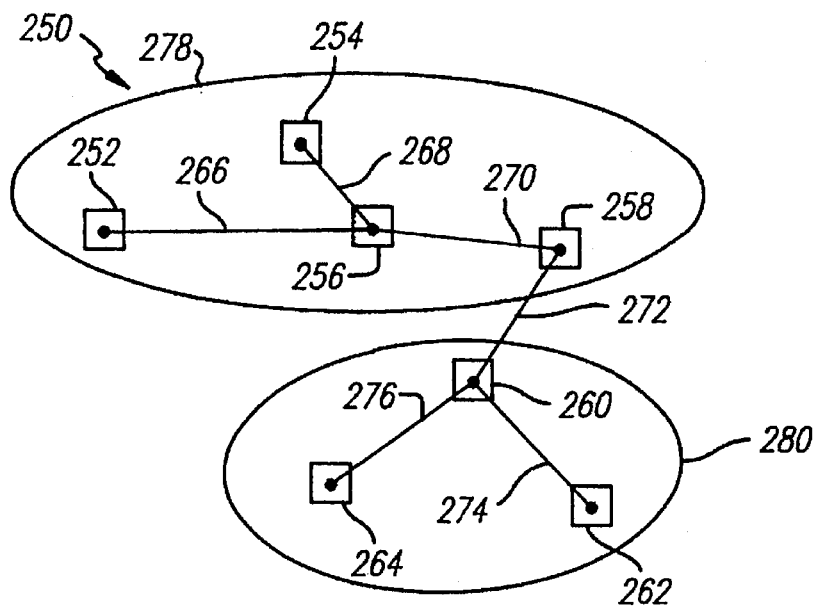
FIG. 6 is a diagram illustrating pre-clusterization.

The pre-clusterization step 52 is illustrated in FIG. 6. A grouping 250 consisting of cells 252 to 264 is interconnected by a net that is represented by edges 266 to 276. The grouping 250 is preferably divided into two pre-clusters 278 and 280 which include the cells 252 to 258 and 260 to 264 respectively. The pre-clusters 278 and 280 are formed such that each includes a selected cell (vertex) that is connected to each other cell in the cluster by a single edge (radius=1).

As illustrated, the cluster 278 includes a selected cell 256 which is connected to the cells 252, 254 and 258 by the single edges 266, 268 and 270 respectively. The cluster 280 includes a selected cell 260 which is connected to the cells 262 and 264 by the single edges 274 and 276 respectively.

Figure 7A:
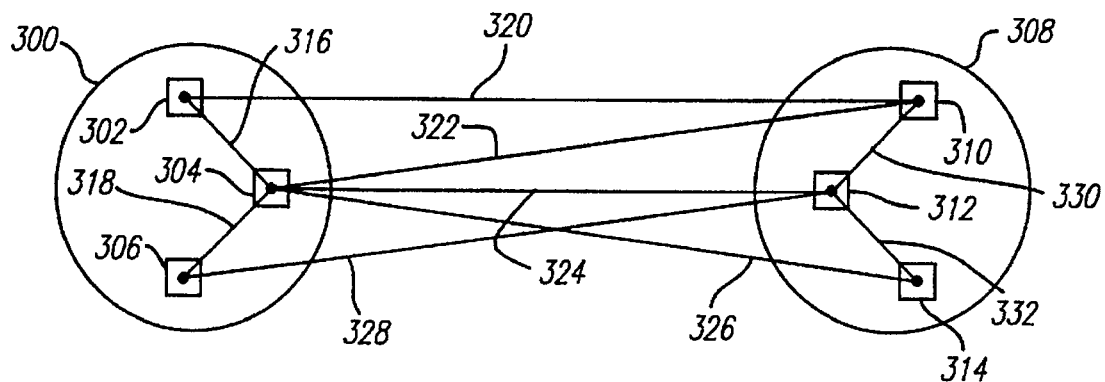
FIGS. 7a to 7c are diagrams illustrating cluster merging.
Figure 7B:
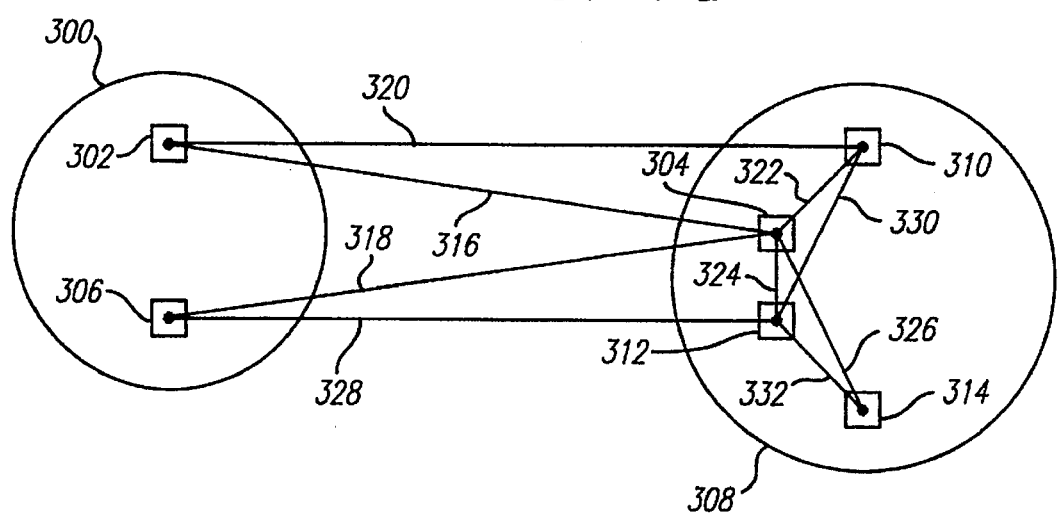
Figure 7C:
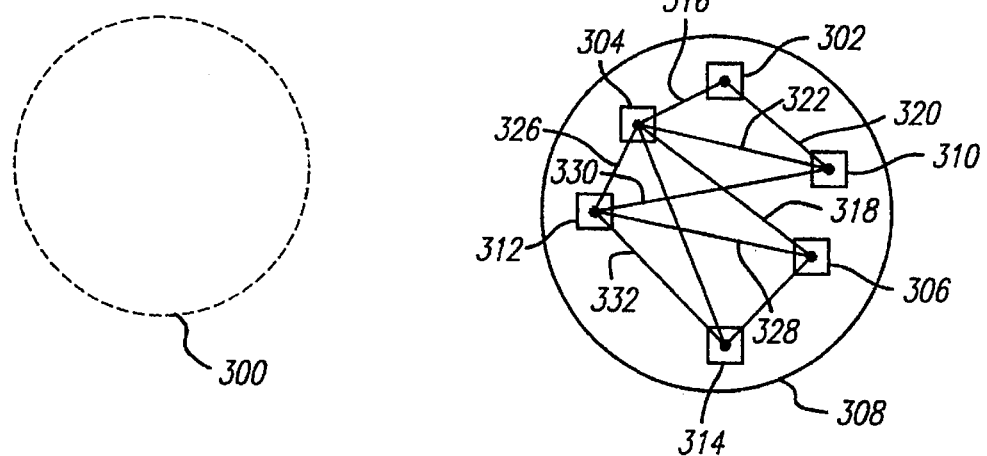

The step 54 of modifying clusters in each level is illustrated in FIGS. 7a to 7c. In FIG. 7a, a cluster 300 includes cells 302 to 306, whereas a cluster 308 includes cells 310 to 314. The cells 302 to 314 are interconnected by edges 316 to 332 as shown. Some of the edges (intra-cell edges) interconnect cells within a cluster, whereas other edges (intercell edges) interconnect cells in different clusters. For example, the edge 316 in FIG. 7a is an intra-cell edge, whereas the edge 320 is an inter-cell edge.

The clusters in each level are modified (some are merged together) using a min-cut type function. Preferably, each cell (vertex) is considered separately, and the numbers of intra-cell edges and inter-cell edges that are connected thereto are calculated. If the number of inter-cell edges is larger than the number of intra-cell edges, the cell is moved from its current cluster to a cluster to which it is connected by the largest number of inter-cell edges. If the numbers are the same, the cell can be left in place or moved randomly.

In FIG. 71, the cell 302 is connected to the cell 304 by the intra-cell edge 316 and to the cell 310 by the inter-cell edge. Since the numbers of intra- and inter-cell edges are the same, the cell 302 is not moved.

The cell 304 has two intra-cell edges 316 and 318, and three inter-cell edges 322, 324 and 326. It is therefore moved from the cluster 300 to the cluster 308 as illustrated in FIG. 7b. The cell 306 has one intra-cell edge 318 and one inter-cell edge 328, and is not moved in this step.

Although the example of FIGS. 7a to 7c does not include updating the status of the clusters after each cell movement, it is within the scope of the invention to do so.

In FIG. 7b, each cell 302 and 306 has no intra-cell edges in the cluster 300 and two inter-cell edges leading to the cluster 308. Thus, in the next iteration, the cells 302 and 306 are moved to the cluster 308 as illustrated in FIG. 7c, leaving the cluster 300 empty. The empty cluster is deleted from the list of clusters for the next highest level.

FIGS. 8a to 8d illustrate how the clustering process proceeds from one level to a successively higher level of the cluster tree. In each level, the cluster modification step 54 can be performed once for each cell, or iteratively repeated until a predetermined criterion is satisfied. In a preferred form of the invention, the step 54 is iteratively performed until the average number of elements (cells or clusters from lower levels) in each cluster is approximately 50-100.

The steps 56 and 58 constitute a loop for constructing successively higher levels of clusters. After performing step 54 to form one level, the clusters in this level are used as the input for forming the next level. When the highest level is reached, which consists of a single cluster, the method continues to the next step 60.

Figure 8A:
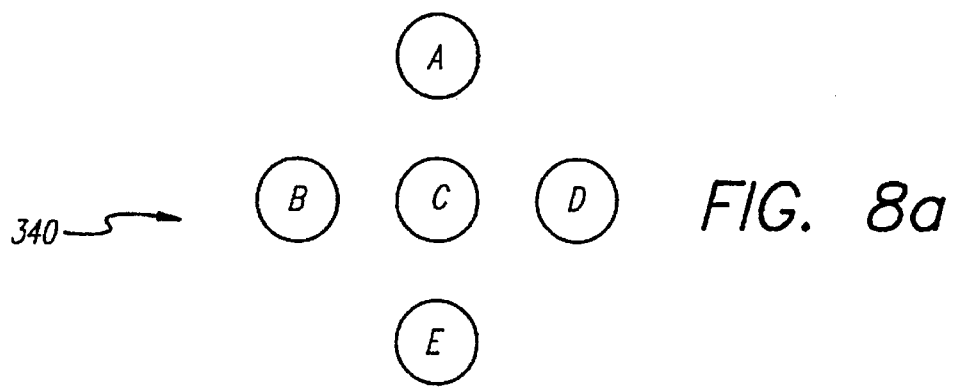
FIGS. 8a to 8d are diagrams illustrating the construction of a cluster tree including four levels of clusters.
Figure 8B:
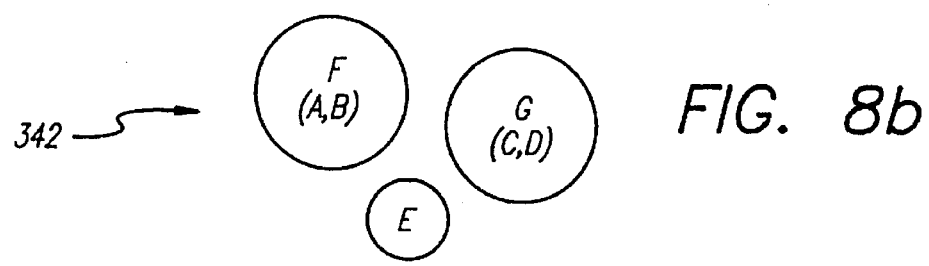

FIG. 8a illustrates a level 340 consisting of clusters A to D. Performing the step 54 for the level 340 results in merging of the clusters A and B to form a cluster F, and merging the clusters C and D to form a cluster G. The next higher level 342 as shown in FIG. 8b consists of the clusters E, F and G.

Figure 8C:
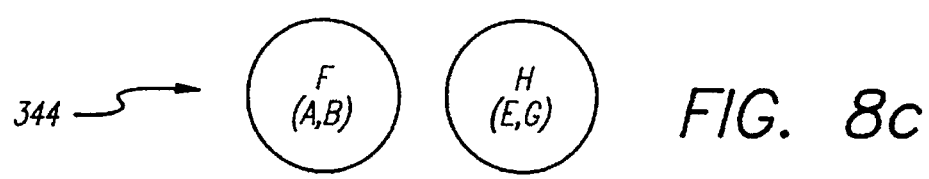
Figure 8D:
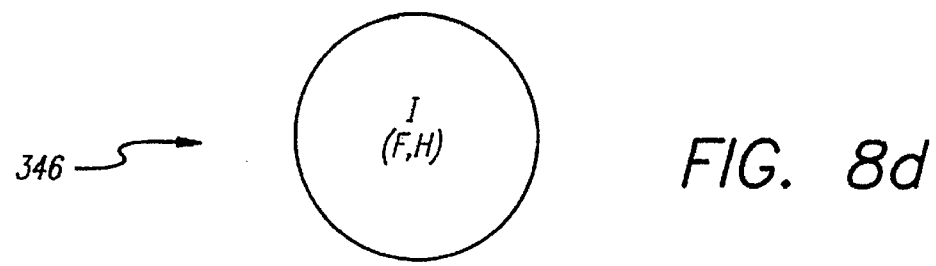

Performing the step 54 on the level 342 results in merging the clusters E and G to form a cluster H consisting of the clusters E and G in a level 344 as illustrated in FIG. 8C. The level 344 consists of the clusters F and H.

The clusters F and H are merged by performing the step 54 on the clusters F and H such that a level 346 consists of a single cluster I including the clusters F and H.

Figure 9:
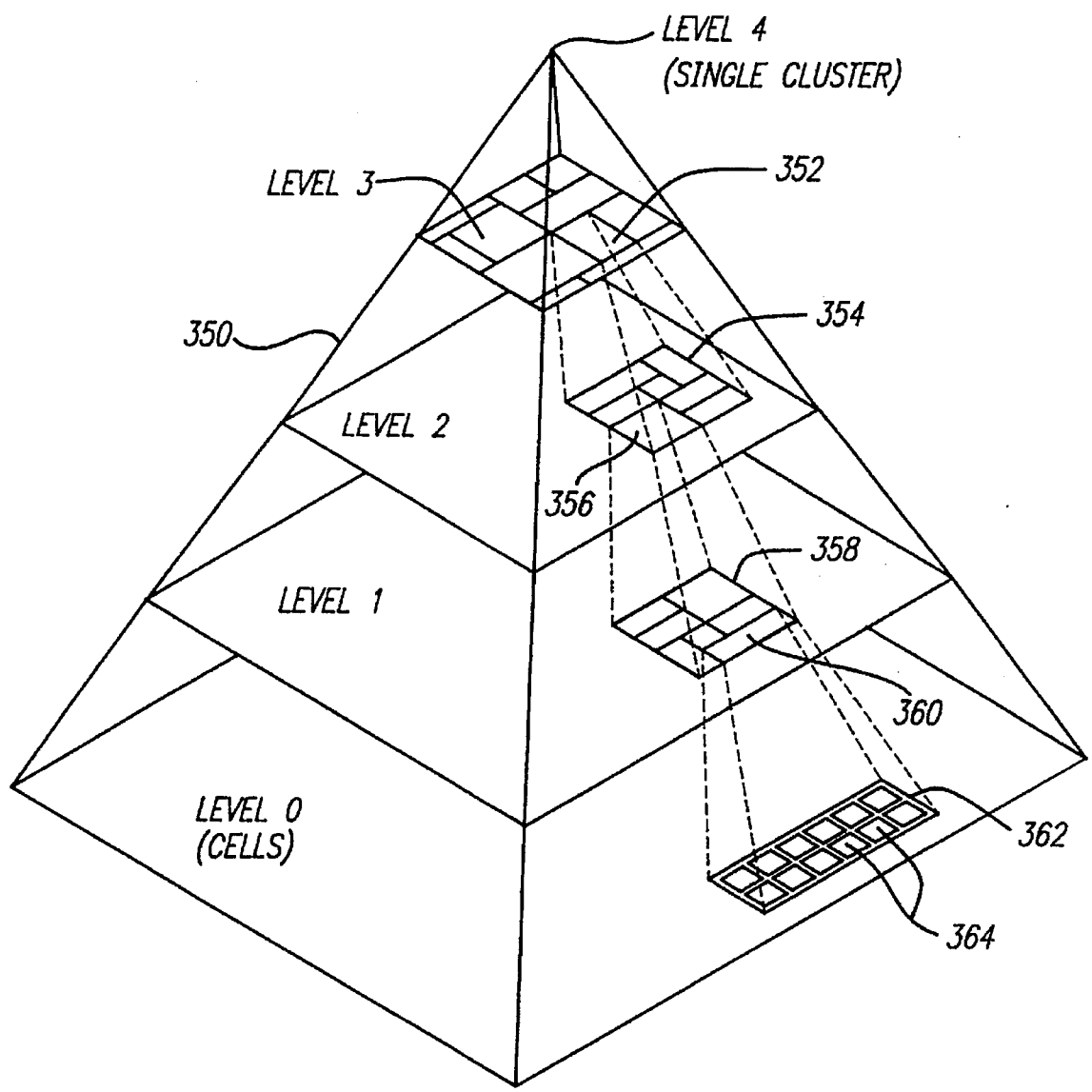
FIG. 9 is a diagram illustrating cluster re-placement for a cluster tree including four levels of clusters.

The re-placement portion of the present method is illustrated conceptually in FIG. 9. A cluster tree 350 is symbolically represented as a pyramid with five exemplary levels of clusters. LEVEL 4 is a single cluster including all of the clusters of LEVEL 3. An exemplary cluster 352 of LEVEL 3 includes a group 354 of clusters of LEVEL 2. An exemplary cluster 356 of the group 354 includes a group 358 of clusters of LEVEL 1, whereas an exemplary cluster 360 of LEVEL 1 includes a group 362 of cells 364 of LEVEL 0. The other clusters of LEVEL 0 TO LEVEL 2 are not shown for simplicity of illustration.

In general, the re-placement operation of the invention generates an efficient placement of subclusters (of the successive lower level) of each cluster in each level. This is performed from the top down, so that the entire surface of the integrated circuit chip is covered hierarchically in a progressively increasing level of detail. Since the plan for a successively lower level is provided by the successively higher level, the re-placement plan is complete, efficient, and avoids local extrema.

Prior to performing the placement portion of the method, the clusters and cells do not have any particular geometric arrangement relative to each other. As illustrated in FIG. 3, for each cluster in each level starting with the highest level (the clusters of LEVEL 3 in FIG. 9), an initial placement of the subclusters in the cluster is generated in any suitable manner (e.g. random). This is the beginning of the complete replacement method of the invention which provides an efficient geometric placement of each cluster and ultimately each cell.

Figure 10:
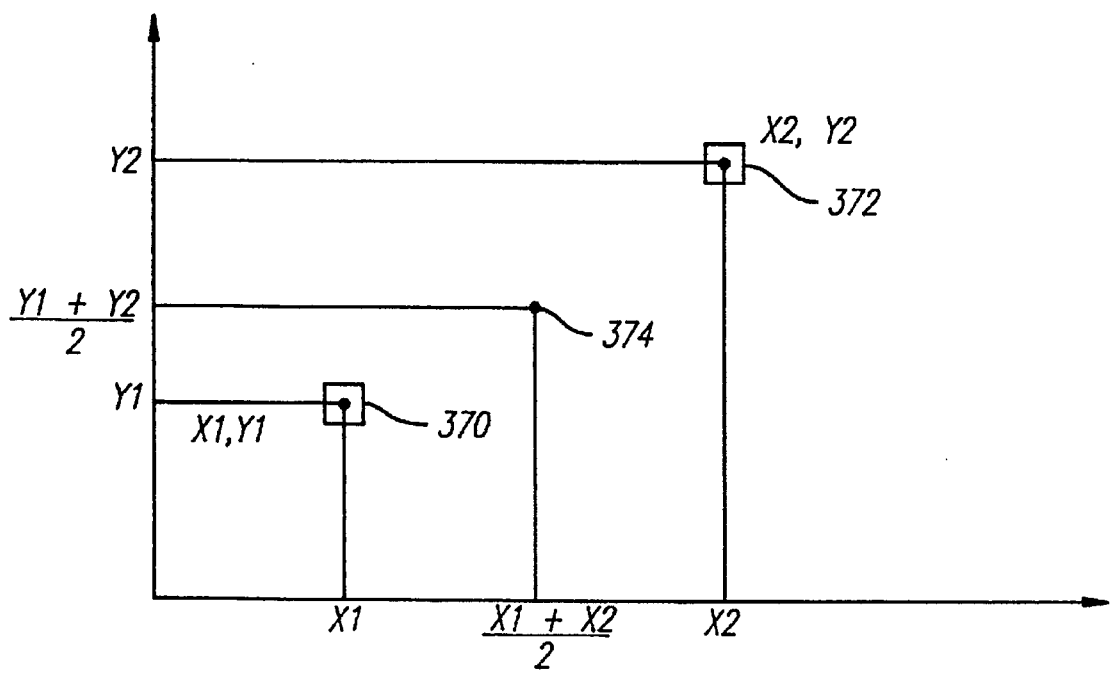
FIG. 10 is a diagram illustrating computation of a gravity point for cluster improvement.

Since clusters represent groups of clusters or cells, a current gravity point is computed for each cluster so that it can be represented by a single point in an orthogonal coordinate system in the step 60. The manner in which the gravity point is computed is illustrated in FIG. 10. The center of gravity computation is illustrated for an exemplary cluster consisting of two cells 370 and 372.

The location of the cell 370 is represented in an orthogonal system of x and y coordinates as x1.y1, whereas the location of the cell 372 is represented as x2,y2. The x component of the center of gravity 374 of the cells 370 and 372 is computed as the average of the x components of the locations the cells 370 and 372, more specifically as (x1+x2)/2. The y component of the center of gravity CG is computed as the average of the y components of the locations of the cells 370 and 372, more specifically as (y1+y2)/2.

Although the computation for only two cells is illustrated in FIG. 10, it will be understood that the operation can be generalized for a cluster comprising any number of cells. It will be further understood that rather than computing the gravity point of each cluster, the scope of the invention includes computing a "centroid"0 for each cluster, which is a general term that can alternatively specify center of gravity, mass, force, area, etc.

The step of FIG. 61 includes modifying the initial placement to produce an improved placement. This is preferably performed by computing a new gravity point for each cluster, and moving the cluster to the new gravity point.

The step 61 utilizes the concept of "force directed placement" in which the clusters (vertices) are modeled as masses and the edges are modeled as springs pulling the clusters together. The gravity point for a given cluster in a given configuration is that point for which all the spring forces acting on that cluster would go to zero if the cluster were moved there. All clusters are assumed to be fixed in their current positions except for the cluster that is selected.

The desired geometric configuration of the placement of subclusters is determined by computing new respective gravity points $(x_1', y_1'), \ldots, (x_n', y_n')$ according to the following formulas:

$$x_j' = \frac{(x_j + m_1 x_{j_1} + \ldots + m_s x_{j_s})}{1 + m_1 + \ldots + m_s}, \quad y_j' = \frac{(y_j + m_1 y_{j_1} + m_s y_{j_s})}{1 + m_1 + \ldots + m_s},$$

where $m_1$ is the number of edges connecting a vertex of the subcluster $K_j$ with a vertex of the subcluster $K_{j1}$.

In other words, for the new gravity point of a subcluster, the gravity point of all edges connecting the subcluster with other subclusters is computed.

After the clusters are placed, an interconnect routing is performed based on the netlist. Step 61 is preferably iteratively repeated as indicated by the step 62 until a predetermined end criterion is reached. This is accomplished by computing a quality factor for each placement iteration which is typically the total length (interconnect wirelength) of all edges in the respective cluster. The end criterion is satisfied when the wirelength for a current iteration has not improved from that of a previous iteration by more than a predetermined value.

Figure 11:
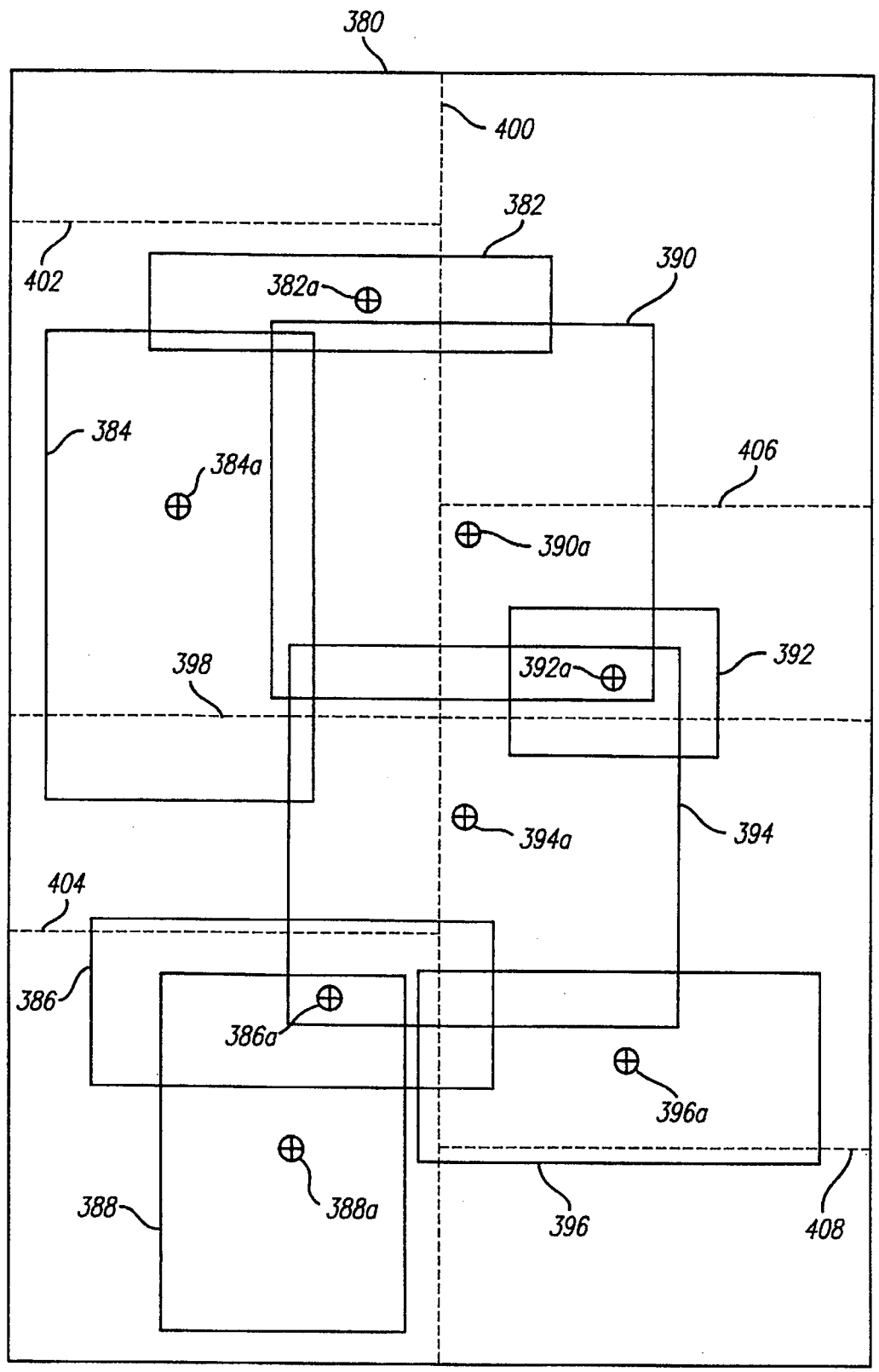
FIG. 11 is a diagram illustrating cluster placement improvement for one cluster level.

After the subclusters are moved to their new gravity points, they are arranged within the area of the placement which was determined for the cluster in the successively higher level. FIG. 11 illustrates an area 380 in which subclusters 382 to 396 of a cluster (not designated) of a successively higher level in the cluster tree are to be placed. The subclusters 382 to 396 have new gravity points 382a to 396a which were computed in the manner described above.

As shown in FIG. 11, the subclusters 382 and 396 have different sizes and partially overlap each other. The subclusters 382 to 396 are re-placed in the area 380 in a manner which removes the overlap. First, a "median interval" is computed in the vertical direction such that the area of the cells above the median interval 398 is equal to the area of the cells below the median interval 398. As shown, the subclusters 382, 384, 390 and 392 are located above the median interval 398, whereas the subclusters 386, 388, 394 and 396 are located below the interval 398.

A similar median interval 400 is then computed in the horizontal direction, such that the cells 382, 384, 386 and 388 are located leftward of the interval 400, whereas the cells 390, 392, 394 and 396 are located rightward of the interval 400.

In this manner, the area 380 has been partitioned into four sections by the intervals 398 and 400, with the subclusters 382 and 384 to be located in the upper left section, the subclusters 390 and 392 to be located in the upper right section, the subclusters 386 and 388 to be located in the lower left section and the subclusters 394 and 396 to be located in the lower right section. The four sections are then partitioned again by median intervals 402 to 408.

Figure 12:
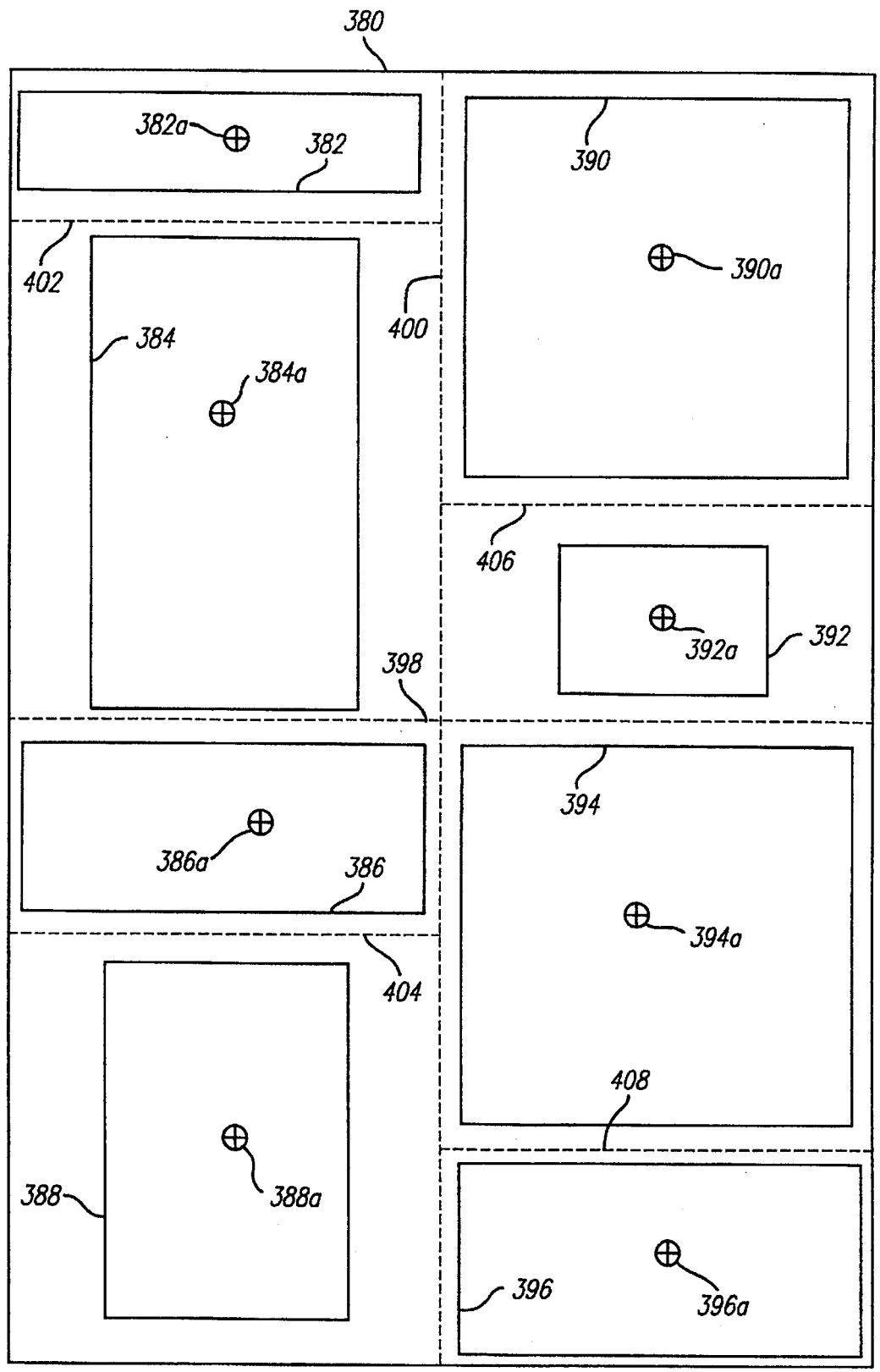
FIG. 12 is a diagram illustrating cluster re-placement for the cluster level of FIG. 11.

The result of the re-placement operation is illustrated in FIG. 12, in which an individual subsection or partition is provided for each subcluster. After the computation of the partitioning is completed, the subclusters are moved to their respective partitions as illustrated.

This operation is performed for all clusters in all of the levels. The top-down planning provided by the present hierarchial clusterization method ensures that each cell is placed in a position that is pre-planned and provides efficient routing based on the specified netlist. A loop provided by the steps 64 and 66 results in progressive placement of the clusters in each level as symbolically illustrated in FIG. 9.

Figure 13:
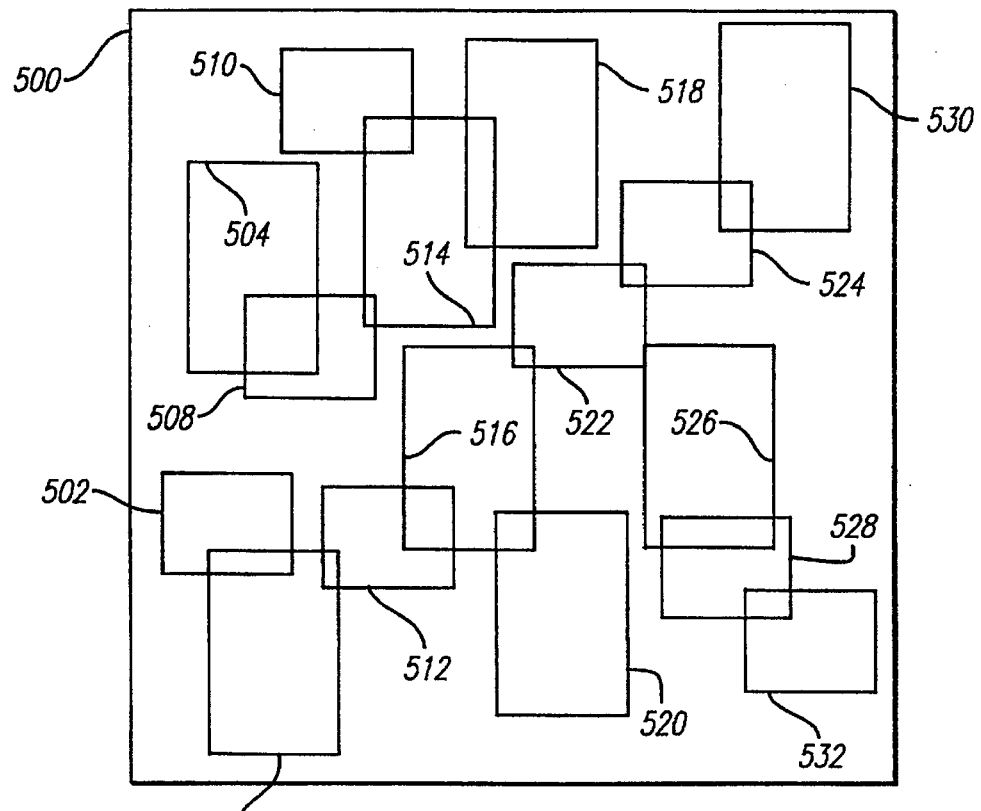
FIG. 13 is a diagram illustrating cells in a lowest cluster level for re-placement.
Figure 14:
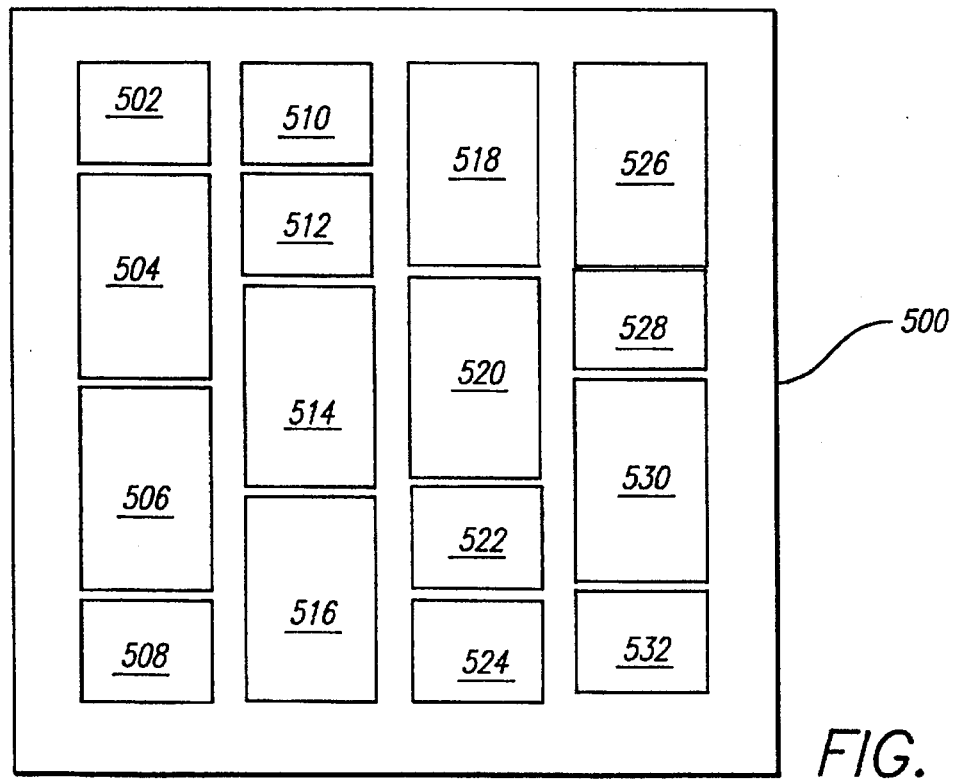
FIG. 14 is a diagram illustrating how the cells of FIG. 13 are re-placed in accordance with the invention.

The cell placement step 68 is illustrated in FIGS. 13 and 14, which places the cells in the preclusters in the lowest level of the cluster tree. FIG. 13 illustrates a placement of cells 502 to 532 in an area 500 that was performed using the gravity point placement operation described above. The cells 502 to 532 are illustrated as having the same width for simplicity of description, but the invention is not so limited.

As with the case of cluster placement, the force directed gravity point method results in cells that partially overlap. The cells are ordered from left to right in accordance with their horizontal (row) position. For example, the cell 502 is the leftmost in FIG. 13, with the cell 504 being the next rightward of the cell 502, etc.

After ordering in the horizontal direction, the cells are arranged vertically in columns in order of their horizontal positions. As illustrated in FIG. 14, a leftmost column includes the cells 502 to 506 which have the leftmost positions in FIG. 13. The next four leftmost cells 510 to 516 are placed in the next right column. The cells 518 to 524 and 526 to 532 are placed in the remaining columns as shown.

In general, after one column has been filled up, the next column begins to be filled with the next leftmost cells, etc. The number of cells that will be placed in each column can vary depending on the heights of the cells, with the sum of the heights of the cells in each column being equal to or less than the height of the column.

In summary, the present invention provides a physical design automation system which is able to generate large clusters without performing an exhaustive search of all possible combinations, while simultaneously overcoming of the effects of local extrema.

Various modifications will become possible for those skilled in the art after receiving the teachings of the present disclosure without departing from the scope thereof.

We claim:

1. A method of producing a placement of cells for a microelectronic integrated circuit in accordance with specified cell interconnects, comprising the steps:

(a) constructing a hierarchial cluster tree in accordance with said interconnects in which a lowest level of said tree includes clusters of said cells, and each successively higher level includes clusters of clusters from a respective successively lower level;

(b) placing said clusters of each successively lower level within respective clusters of each successively higher level in progressively decreasing order of levels by computing a gravity point for each cluster and modifying cell placement based on a predetermined gravity point adjustment function; and (c) placing said cells within respective clusters of said lowest level.

2. A method as in claim 1, in which step (a) comprises the substeps of:

(a1) representing said cells and said interconnects as a hypergraph; and (a2) converting said hypergraph into a graph in which said cells are represented by vertices and said interconnects are represented by edges.

3. A method as in claim 2, wherein said edges are defined in accordance with a predetermined function.

4. A method as in claim 3, wherein said predetermined function comprises defining said edges in a chain configuration.

5. A method as in claim 3, wherein said predetermined function comprises defining said edges in a star configuration.

6. A method as in claim 3, wherein said predetermined function comprises defining said edges in a tree configuration.

7. A method as in claim 1, in which step (a) comprises the substeps of:

(a1) creating disjoint clusters of said cells in accordance with a first predetermined function to produce said lowest level; and (a2) merging clusters of each successively lower level in accordance with a second predetermined function to produce said clusters of each respective successively higher level.

8. A method as in claim 7, wherein said first predetermined function comprises creating each disjoint cluster as including a selected cell, and cells that are connected to said selected cell by one interconnect respectively.

9. A method as in claim 7, wherein said second predetermined function comprises a min-cut operation.

10. A method as in claim 9, in which step (a2) comprises the substeps, for each cell, of:

(i) computing a first number of intra-cluster interconnects;

(ii) computing a second number of inter-cell interconnects; and (iii) if said second number is larger than said first number, moving said cell to a cluster to which said cell is connected by a largest number of inter-cell interconnects.

11. A method as in claim 7, in which step (a) further comprises the substep of:

(a3) iteratively repeating step (a2) for each level until said level comprises a number of cells or clusters from lower levels within a predetermined range.

12. A method as in claim 11, in which said predetermined range is approximately 50–100 cells or clusters from lower levels.

13. A method as in claim 7, in which step (a) further comprises the substep of:

(a3) performing step (a2) for progressively higher levels until a highest level is produced which consists of one cluster.

14. A method as in claim 1, wherein step (b) comprises the substeps, for each level of clusters, the steps of:

(b1) generating an initial placement of said clusters; and (b2) modifying said initial placement in accordance with a predetermined function to produce an improved placement.

15. A method as in claim 1, wherein modifying cell placement based on a predetermined gravity point adjustment function comprises:

(i) computing a new gravity point for each cluster based on the current gravity point and a number of interconnects connecting cluster vertices, wherein clusters are modeled as masses and interconnects are modeled as springs pulling clusters together; and (ii) moving each cluster from said current gravity point to said new gravity point.

16. A method as in claim 15, in which step (i) further comprises, for each cluster, computing said new gravity point in accordance with directions and distances from said current gravity point to said current gravity points of other clusters to which said cluster is connected, and numbers of interconnects that connect said cluster to said other clusters.

17. A method as in claim 15, further comprising:

(iii) iteratively repeating steps (i) and (ii) until a predetermined criterion is satisfied.

18. A method as in claim 17, in which step (iii) comprises the substeps, performed after each iteration of steps (i) and (ii), of:

(A) computing a quality factor of said placement of said clusters of said level; and (B) iteratively repeating steps (i) and (ii) if said computed quality factor has a value that is different from a computed quality factor of a previous iteration by more than a predetermined value.

19. A method as in claim 18, wherein said quality factor is a total length of said interconnects of said placement of said clusters of said level.

20. A method as in claim 1, in which step (c) comprises the substeps, for each cluster of said lowest level, of:

(c1) calculating positions of said cells in a first direction; and (c2) placing said cells along lines which extend in a second direction that is perpendicular to said first direction in increasing order of said calculated positions in said first direction.

21. A physical design automation system for producing a placement of cells for a microelectronic integrated circuit in accordance with specified cell interconnects, comprising:

tree construction means for constructing a hierarchial cluster tree in accordance with said interconnects in which a lowest level of said tree includes clusters of said cells, and each successively higher level includes clusters of clusters from a respective successively lower level;

cluster placement means for placing said clusters of each successively lower cell within respective clusters of each successively higher level in progressively decreasing order of levels by computing a gravity point for each cluster and modifying cell placement based on a predetermined gravity point adjustment function; and cell placement means for placing said cells respective clusters of said lowest level.

22. A system as in claim 21, in which the tree construction means comprises:

cell representation means for representing said cells and said interconnects as a hypergraph; and graph conversion means for converting said hypergraph into a graph in which said cells are represented by vertices and said interconnects are represented by edges.

23. A system as in claim 22, wherein said edges are defined in accordance with a predetermined function.

24. A system as in claim 23, wherein said predetermined function comprises means for defining said edges in a chain configuration.

25. A system as in claim 23, wherein said predetermined function comprises means for defining said edges in a star configuration.

26. A system as in claim 23, wherein said predetermined function comprises means for defining said edges in a tree configuration.

27. A system as in claim 21, in which the tree construction means comprises:

pre-clusterization means for creating disjoint clusters of said cells in accordance with a first predetermined function to produce said lowest level; and cluster modification means for merging clusters of each successively lower level in accordance with a second predetermined function to produce said clusters of each respective successively higher level.

28. A system as in claim 27, in which the first predetermined function comprises means for creating each disjoint cluster as including a selected cell, and cells that are connected to said selected cell by one interconnect respectively.

29. A system as in claim 27, in which the second predetermined function comprises means for merging said clusters using a min-cut operation.

30. A system as in claim 29, in which the cluster modification means comprises:

first computation means for computing, for each cell, a first number of intra-cluster interconnects;

second computation means for computing a second number of inter-cluster interconnects; and cell movement means for, if said second number is larger than said first number, moving said cell to a cluster to which said cell is connected by a largest number of inter-cell interconnects.

31. A system as in claim 27, in which the tree construction means further comprises:

control means for controlling the cluster modification means to iteratively merge clusters of each level until said level comprises a number of cells or clusters from lower levels within a predetermined range.

32. A system as in claim 31, in which said predetermined range is approximately 50–100 cells or clusters from lower levels.

33. A system as in claim 27, in which the tree construction means further comprises:

control means for controlling the cluster modification means to merge clusters for progressively higher levels until a highest level is produced which consists of one cluster.

34. A system as in claim 21, in which the cluster placement means further comprises:

initial placement generation means for generating an initial placement of said clusters; and placement modification means for modifying said initial placement in accordance with a predetermined function to produce an improved placement.

35. A system as in claim 21, wherein modifying cell placement based on a predetermined gravity point adjustment function comprises:

new gravity point computation means for computing a new gravity point for each cluster in accordance with said current gravity points and said interconnects based on the current gravity point and a number of interconnects connecting cluster vertices, wherein clusters are modeled as masses and interconnects are modeled as springs pulling clusters together; and cluster movement means for moving each cluster from said current gravity point to said new gravity point.

36. A system as in claim 35, in which:

the new gravity point computation means comprises means for computing, for each cluster, said new gravity point in accordance with directions and distances from said current gravity point to said current gravity points of other clusters to which said cluster is connected, and numbers of interconnects that connect said cluster to said other clusters.

37. A system as in claim 35, in which the cluster placement means further comprises:

control means for controlling the placement modification means to iteratively modify said initial placement until a predetermined criterion is satisfied.

38. A system as in claim 37, in which the control means comprises:

quality computation means for computing a quality factor of said placement of said clusters of each level; and iteration means for controlling the placement modification means to iteratively modify said initial placement if said computed quality factor has a value that is different from a computed quality factor of a previous iteration by more than a predetermined value.

39. A system as in claim 38, wherein said quality factor is a total length of said interconnects of said placement of said clusters of said level.

40. A system as in claim 21, in which the cell placement means comprises:

calculation means for calculating positions of said cells in each cluster of said lowest level in a first direction; and means for placing said cells along lines which extend in a second direction that is perpendicular to said first direction in increasing order of said calculated positions in said first direction.

41. A system as in claim 21, in which the tree construction means, cluster placement means and cell placement means collectively comprise a parallel processing system including a plurality of parallel processors.

* * * * *